United States Patent
Kuga

(10) Patent No.: US 11,502,472 B2
(45) Date of Patent: Nov. 15, 2022

(54) METHOD OF MANUFACTURING ELECTRICAL CONTACTOR

(71) Applicant: KABUSHIKI KAISHA NIHON MICRONICS, Tokyo (JP)

(72) Inventor: Tomoaki Kuga, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 0 days.

(21) Appl. No.: 17/229,324

(22) Filed: Apr. 13, 2021

(65) Prior Publication Data

US 2021/0376548 A1    Dec. 2, 2021

(30) Foreign Application Priority Data

May 28, 2020 (JP) .............................. JP2020-093038

(51) Int. Cl.
*H01R 43/16*    (2006.01)

(52) U.S. Cl.
CPC ......... *H01R 43/16* (2013.01); *H01R 2201/20* (2013.01)

(58) Field of Classification Search
CPC .. H01R 43/16; H01R 23/2421; H01R 13/111; G01R 3/00; G01R 1/0416; G01R 31/2884; G01R 1/06722; Y10T 29/49204; Y10T 29/53209
USPC .......................................... 29/874, 882, 747
See application file for complete search history.

(56) References Cited

U.S. PATENT DOCUMENTS

| 4,961,709 A | * | 10/1990 | Noschese | ........... | H01R 13/2421 |
| | | | | | 439/82 |
| 7,491,069 B1 | * | 2/2009 | Di Stefano | ........... | H01R 13/111 |
| | | | | | 439/841 |
| 7,520,753 B1 | * | 4/2009 | Mulligan | ........... | H01R 13/2421 |
| | | | | | 439/91 |

FOREIGN PATENT DOCUMENTS

| JP | 2011012992 A | 1/2011 |
| TW | 202040138 A | 11/2020 |

OTHER PUBLICATIONS

First OA issued on May 27, 2022 in corresponding Taiwan Patent Application No. 110114066.

* cited by examiner

*Primary Examiner* — Donghai D Nguyen
(74) *Attorney, Agent, or Firm* — Bacon & Thomas, PLLC

(57) ABSTRACT

To provide a method of manufacturing an electrical contactor including a volute spring structure extending in upward and downward directions formed integrally using a single material, having mechanical simplicity and excellent functionality, and functioning as an electric circuit achieving connection without loss.

The present disclosure is intended for a method of manufacturing an electrical contactor made of a plate-like member having electrical conductivity, comprising: (1) a first step of forming the plate-like member into a barrel shape by winding the plate-like member in a spiral pattern; (2) a second step of compressing the plate-like member formed into the barrel shape from a vertical direction until the plate-like member assumes a volute shape with an upper spiral structure and a lower spiral structure overlapping each other; and (3) a third step of forming a volute-shaped electrical contactor by performing predetermined hardening (Continued)

treatment on the plate-like member temporarily assuming the volute shape as a result of the second step.

4 Claims, 7 Drawing Sheets

METHOD OF MANUFACTURING ELECTRICAL CONTACTOR

CROSS-REFERENCE TO RELATED APPLICATIONS

The present application claims, under 35 USC 119, priority of Japanese Patent Application No. 2020-093038 filed on May 28, 2020.

TECHNICAL FIELD

The present disclosure relates to an electrical contactor and a method of manufacturing the electrical contactor, and is applicable to an electrical contactor used for a current-carrying test on an integrated circuit on a semiconductor wafer or a test subject, for example, and a method of manufacturing the electrical contactor.

BACKGROUND ART

A test subject such as an integrated circuit formed on a semiconductor wafer or a packaged integrated circuit is subjected to a test for electrical characteristics at each manufacturing stage. An electrical test on an integrated circuit on a semiconductor wafer is conducted using an electrical connecting apparatus such as a probe card. An electrical test on a packaged integrated circuit is conducted using an electrical connecting apparatus such as a socket. In such electrical connecting apparatuses, an electrical contactor to contact a first contact target and a second contact target is used, and an electrical signal is conducted between the first contact target and the second contact target through the electrical contactor.

Various types of electrical contactors conventionally existing include an electrical contactor formed by combining a plurality of constituting members. If an electrical signal is to be conducted between the first contact target and the second contact target using such an electrical contactor formed using a combination of a plurality of constituting members, a resistance may be increased at a point of contact between the constituting members, and this may cause there to be an influence on the electrical conduction performance.

Patent literature 1 discloses a spring probe with a spiral and tubular sleeve, a first terminal at one end of the tubular sleeve, and a second end at the other end of the tubular sleeve formed integrally by bending a thin strip-shaped substrate. As this spring probe is formed integrally using the thin strip-shaped substrate, favorable electrical conductivity is achieved.

PRIOR ART

Patent Literature

Patent Literature 1: Japanese Patent Application Publication No. 2011-12992

SUMMARY OF INVENTION

Problem to be Solved by Invention

If an electrical signal is conducted between the first contact target and the second contact target using the spring probe disclosed in patent literature 1, however, an electrical conduction path in the spring probe passes through a pair of coil springs wound in a spiral pattern. This extends the length of the path to bring about the need for improving electrical conduction performance.

In this regard, a volute spring formed by winding a plate-like member into a spiral pattern, and covering a part of an inner member with an outer member may be used as it is as an electrical contactor, for example.

As the electrical contactor having the volute spring structure is formed by winding one plate-like member, a point of contact between constituting members can be eliminated. This makes it possible to reduce a resistance value at a conduction path in the electrical contactor of the volute spring structure. This further makes it possible to shorten the length of the conduction path in the electrical contactor of the volute spring structure, so that favorable electrical conduction performance is expected to be achieved.

During implementation of a test on a test subject, to cause the electrical contactor to electrically contact the first contact target and the second contact target reliably, the electrical contactor desirably has elasticity in upward and downward directions. To achieve this, the electrical contactor of the volute spring structure may include a first plate-like member extending diagonally upward and a second plate-like member extending diagonally downward, and each of the first plate-like member and the second plate-like member may be wound to form a volute spring part extending further in the upward direction than a center part in an axis direction and a volute spring part extending further in the downward direction than the center part, for example.

For formation of the electrical contactor of the volute spring structure, winding proceeds while overlapping in such a manner as to cover a part of the inner member with the outer member. There is a problem in that this undertaking becomes difficult.

As an example, a volute spring structure extending further in an upward direction and a downward direction than a center part in an axis direction may be formed by forming two volute springs through winding in one direction, and fixing the large-diameter side ends of these volute springs to each other by welding, etc. However, a material used in this formation is not a single material, so a point of connection between different members is formed in the resultant structure. This becomes a cause for concern in terms of mechanical functionality and electrical conduction performance.

In view of the foregoing problem, the present disclosure is intended to provide an electrical contactor including a volute spring structure extending in upward and downward directions formed integrally using a single material, having mechanical simplicity and excellent functionality, and functioning as an electric circuit achieving connection without loss, and a method of manufacturing the electrical contactor.

Means of Solving Problem

A first aspect of the present disclosure is a method of manufacturing an electrical contactor made of a plate-like member having electrical conductivity, comprising: (1) a first step of forming the plate-like member into a barrel shape by winding the plate-like member in a spiral pattern; (2) a second step of compressing the plate-like member formed into the barrel shape from a vertical direction until the plate-like member assumes a volute shape with an upper spiral structure and a lower spiral structure overlapping each other; and (3) a third step of forming a volute-shaped electrical contactor by performing predetermined hardening treatment on the plate-like member temporarily assuming the volute shape as a result of the second step.

A second aspect of the present disclosure is an electrical contactor made of a plate-like member having electrical conductivity, and manufactured by: (1) forming the plate-like member into a barrel shape by winding the plate-like member in a spiral pattern; (2) compressing the plate-like member formed into the barrel shape from a vertical direction until the plate-like member assumes a volute shape with an upper spiral structure and a lower spiral structure overlapping each other; and (3) manufacturing the electrical contactor as a volute-shaped electrical contactor by performing predetermined hardening treatment on the plate-like member temporarily assuming the volute shape.

Advantageous Effects of Invention

The present disclosure provides an electrical contactor including a volute spring structure extending in upward and downward directions formed integrally using a single material, having mechanical simplicity and excellent functionality, and functioning as an electric circuit achieving connection without loss, and a method of manufacturing the electrical contactor.

Figure 1:
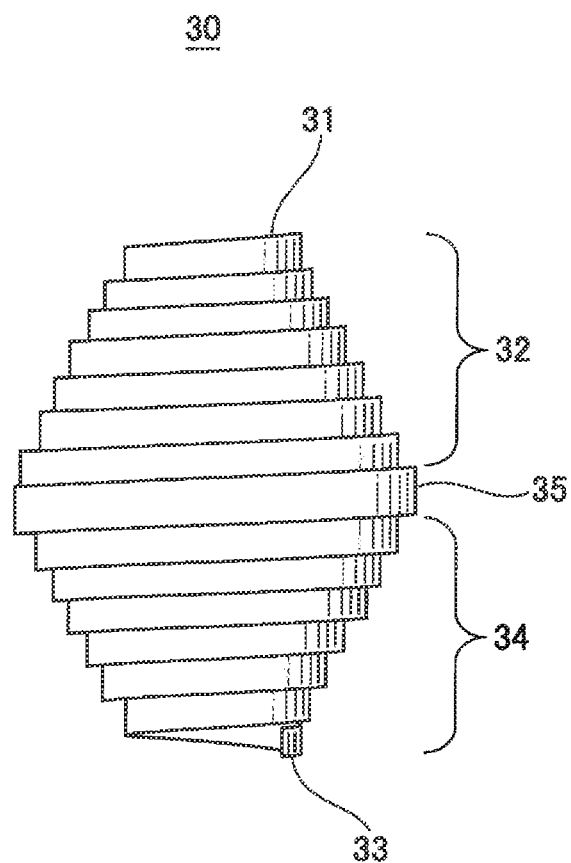
FIG. 1 is a configuration view showing the configuration of a connector according to an embodiment.

EMBODIMENT FOR CARRYING OUT INVENTION (A) Principal Embodiment

In the following, an embodiment of an electrical contactor and a method of manufacturing the electrical contactor according to the present disclosure will be described in detail by referring to the drawings.

According to an exemplary case described in the embodiment, the electrical contactor according to the present disclosure is applied to a connector mounted on an electrical connecting unit as a constituting member of an electrical connecting apparatus, as will be described later. The electrical contactor according to the present disclosure is applicable to a part to electrically contact a first contact target and a second contact target, and to allow conduction of an electrical signal between the first contact target and the second contact target. According to the exemplary case described in the embodiment, while the electrical contactor according to the present disclosure is applied to the connector of the electrical connecting unit, the present disclosure is further applicable to a probe, etc., to be connected to an electrode terminal of a test subject.

According to the exemplary case described in the embodiment, the electrical connecting apparatus according to the present disclosure is an electrical connecting apparatus used for an electrical test on a test subject that is an integrated circuit formed on a semiconductor wafer. The electrical connecting apparatus according to the present disclosure is applicable to an apparatus for electrical conduction of an electrical signal between a first contact target and a second contact target using the electrical contactor according to the present disclosure.

(A-1) Configuration of Embodiment (A-1-1) Electrical Connecting Apparatus

Figure 2:
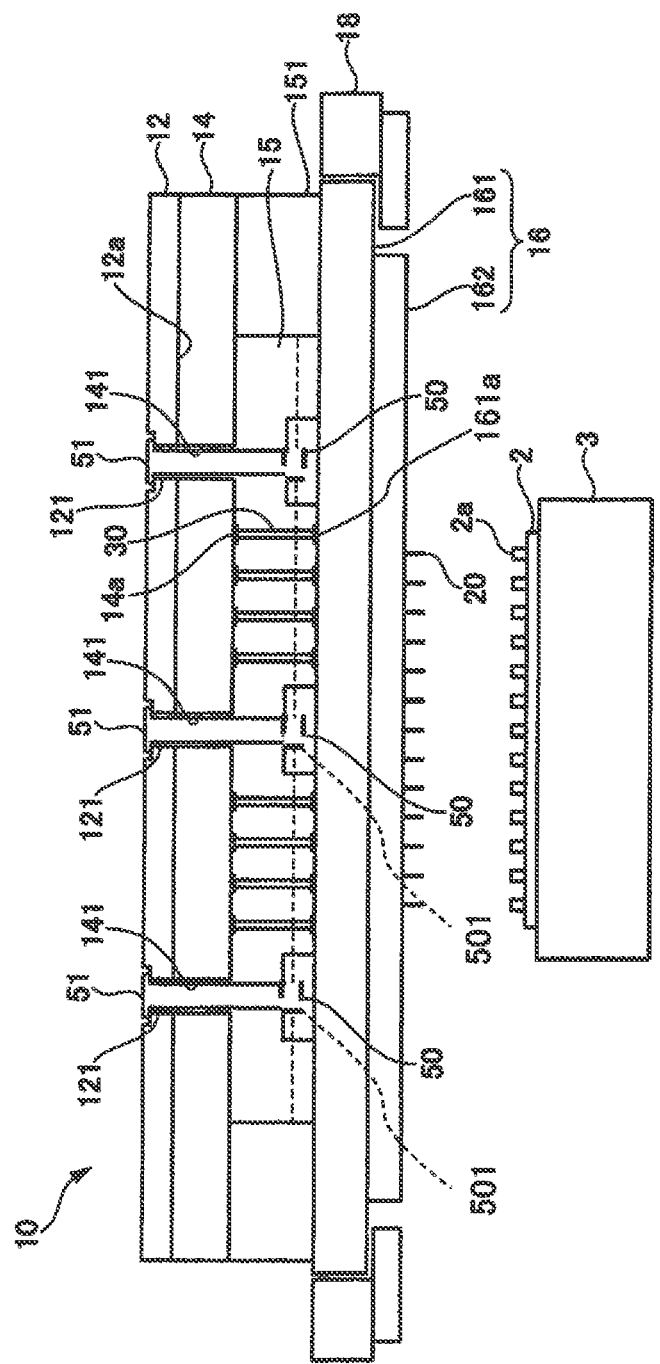
FIG. 2 is a configuration view showing the configuration of an electrical connecting apparatus according to the embodiment.

FIG. 2 is a configuration view showing the configuration of the electrical connecting apparatus according to the embodiment.

While FIG. 2 shows principal constituting members of an electrical connecting apparatus 10, the electrical connecting apparatus 10 is not limited to these constituting members but includes a constituting member not shown in FIG. 2. "Upward" and "downward" in the following description are mentioned in relation to upward and downward directions in FIG. 2.

In FIG. 2, the electrical connecting apparatus 10 according to the embodiment includes a support member 12 like a flat plate, a wiring board 14 like a flat plate held on a lower surface 12a of the support member 12, an electrical connecting unit 15 electrically connected to the wiring board 14, and a probe substrate 16 electrically connected to the electrical connecting unit 15 and including a plurality of probes 20.

A large number of fixing members (a screw member such as a bolt, for example) are used for assembling the support member 12, the wiring board 14, the electrical connecting unit 15, and the probe substrate 16 into the electrical connecting apparatus 10. The illustrations of these fixing members are omitted from FIG. 2.

The electrical connecting apparatus 10 is to conduct an electrical test on a test subject 2 that is a semiconductor integrated circuit formed on a semiconductor wafer, for example. More specifically, the electrical connecting apparatus 10 conducts an electrical test on the test subject 2 by pressing the test subject 2 toward the probe substrate 16, forming electrical contact between the tip of each probe 20 of the probe substrate 16 and an electrode terminal 2a of the test subject 2, supplying an electrical signal to the electrode terminal 2a of the test subject 2 from a tester (testing device) not shown in the drawings, and applying an electrical signal from the electrode terminal 2a of the test subject 2 toward the tester.

The test subject 2 to be tested is placed on the upper surface of a chuck top 3. The chuck top 3 is adjustable in a position in an X-axis direction corresponding to a horizontal direction, in a Y-axis direction vertical to the X-axis direction on a horizontal plane, and in a Z-axis direction vertical to the horizontal plane (X-Y plane). The chuck top 3 is further adjustable in a posture of rotation in a 6 direction about the Z axis. For implementation of an electrical test on the test subject 2, a chuck movable in the upward and downward directions (Z-axis direction) is moved to cause the electrode terminal 2a of the test subject 2 to electrically contact the tip of each probe 20 of the probe substrate 16. To achieve this, the chuck top 3 is moved in such a manner that the lower surface of the probe substrate 16 of the electrical connecting apparatus 10 and the test subject 2 on the upper surface of the chuck top 3 move closer to each other relatively.

[Support Member]

The support member 12 is to suppress the deformation (distortion, for example) of the wiring board 14. For reasons such as the presence of a large number of the probes 20 at the probe substrate 16, for example, the weight of the probe substrate 16 attached to the side of the wiring board 14 is increased. Further, during implementation of an electrical test on the test subject 2, the probe substrate 16 is pressed against the test subject 2 on the chuck top 3 to form electrical contact between the tip of the probe 20 projecting from the lower surface of the probe substrate 16 and the electrode terminal 2a of the test subject 2. In this way, during implementation of the electrical test, reactive force (contact load) pushing upward from below acts to apply large load on the wiring board 14, too. The support member 12 functions as a member for suppressing the deformation (distortion, for example) of the wiring board 14.

The support member 12 is provided with a plurality of through holes 121 penetrating the support member 12 between the upper surface and the lower surface thereof. Each of the through holes 121 is provided at a position corresponding to the position of each of a plurality of anchors 50 arranged on the upper surface of the probe substrate 16 described later, and at a position corresponding to the position of each of a plurality of through holes 141 provided at the wiring board 14.

A spacer (hereinafter also called a "support") 51 is inserted downward from above the support member 12 to be passed through each through hole 121 of the support member 12. The spacer (support) 51 is configured in such a manner that the lower end thereof is fixable to the corresponding anchor 50. For example, the lower end of the spacer (support) 51 is configured as a male screw part and a substantially central part of the anchor 50 arranged on the upper surface of the probe substrate 16 is configured as a female screw part 501. The lower end of the spacer 51 can be fixed to the anchor 50 by the threaded engagement between the lower end (male screw part) of the spacer (support) 51 and the female screw part of the anchor 50. By doing so, it becomes possible to maintain a distance between the upper surface of the probe substrate 16 and the upper surface of the support member 12 at a predetermined length.

[Wiring Board]

The wiring board 14 is made of a resin material such as polyimide, for example, and is a printed board formed into a shape like a substantially circular plate, for example. A large number of electrode terminals (not shown in the drawings) for electrical connection to a test head (not shown in the drawings) of the tester (testing device) are arranged at a peripheral area of the upper surface of the wiring board 14. A wiring pattern is formed on the lower surface of the wiring board 14. A connection terminal 14a of the wiring pattern is configured to be electrically connected to the upper end of a connector 30 provided at the electrical connecting unit 15.

A wiring circuit (not shown in the drawings) is further formed in the wiring board 14. The wiring pattern on the lower surface of the wiring board 14 and an electrode terminal on the upper surface of the wiring board 14 are connectable through the wiring circuit in the wiring board 14. This makes it possible to conduct an electrical signal through the wiring circuit in the wiring board 14 between each connector 30 of the electrical connecting unit 15 electrically connected to the connection terminal 14a of the wiring pattern on the lower surface of the wiring board 14 and the test head connected to the electrode terminal on the upper surface of the wiring board 14. The wiring board 14 further includes a plurality of electronic parts arranged on the upper surface thereof necessary for conducting an electrical test on the test subject 2.

The wiring board 14 is provided with a plurality of through holes 141 penetrating the wiring board 14 between the upper surface and the lower surface thereof. Each of the through holes 141 is arranged at a position corresponding to the position of each of the anchors 50 arranged on the upper surface of the probe substrate 16, and is arranged at a position corresponding to the position of each of the through holes 121 of the support member 12.

Each through hole 141 has an opening shape that can be determined in response to the shape of the support 51 passed through the through hole 141. To allow the support 51 to be passed through each through hole 141, the inner diameter of each through hole 141 is nearly equal to or slightly greater than the outer diameter of the support 51.

As the support 51 according to the exemplary case described in the embodiment is a circular columnar member, the through hole 141 has a substantially circular opening shape. However, it is not limited to this. The support 51 may be a right prism member with a substantially square sectional shape or may be a polygonal prism member with a polygonal sectional shape, for example. Even in these examples, the through hole 141 can still have an opening shape allowing the support 51 to be passed through the through hole 141.

[Electrical Connecting Unit]

The electrical connecting unit 15 includes a plurality of connectors 30. In the electrical connecting apparatus 10 in an assembled state, the upper end of each connector 30 is electrically connected to the connection terminal 14a of the wiring pattern on the lower surface of the wiring board 14, and the lower end of each connector 30 is connected to a pad provided on the upper surface of the probe substrate 16. As the tip of the probe 20 electrically contacts the electrode terminal of the test subject 2, the electrode terminal of the test subject 2 becomes electrically connected to the tester (testing device) through the probe 20 and the connector 30. By doing so, the test subject 2 becomes capable of undergoing an electrical test using the tester (testing device).

For example, the electrical connecting unit 15 has a plurality of passage holes for passing the corresponding connectors 30 therethrough. Passing each connector 30 through a corresponding one of the passage holes makes the upper end and the lower end of each connector 30 project. A mechanism of fitting the plurality of connectors 30 at the electrical connecting unit 15 is not limited to a configuration of providing the through holes, but various types of configurations are widely applicable. A flange 151 is provided on the periphery of the electrical connecting unit 15.

[Probe Substrate]

The probe substrate 16 is a substrate including a plurality of probes 20 and is formed into a substantially circular shape or a polygonal shape (hexadecagonal shape, for example). The probe 20 can be, but is not limited to a cantilever probe, for example. The probe substrate 16 includes a substrate member 161 made of a ceramic plate, for example, and a multilayer wiring board 162 formed on the lower surface of the substrate member 161.

The substrate member 161 as a ceramic substrate, is provided with a large number of electrical conduction paths (not shown in the drawings) penetrating the substrate member 161 in the thickness direction thereof. A pad 161a is formed on the upper surface of the substrate member 161. The electrical conduction path in the substrate member 161 is formed in such a manner that one end thereof is connected to the corresponding pad 161a on the upper surface of the substrate member 161. The electrical conduction path in the substrate member 161 is also formed in such a manner that the other end thereof is connected on the lower surface of the substrate member 161 to a connection terminal provided on the upper surface of the multilayer wiring board 162.

The multilayer wiring board 162 is formed using a plurality of multilayer boards made of a synthetic resin material such as polyimide, for example. A wiring path (not shown in the drawings) is formed between the plurality of multilayer boards. One end of the wiring path in the multilayer wiring board 162 is connected to the other end of the electrical conduction path of the substrate member 161 side as a ceramic substrate, and the other end of the multilayer wiring board 162 is connected to a probe land provided on the lower surface of the multilayer wiring board 162. A plurality of the probes 20 is arranged in the probe land on the lower surface of the multilayer wiring board 162, and the plurality of probes 20 of the probe substrate 16 are electrically connected through the electrical connecting unit 15 to the corresponding connection terminals 14a of the wiring board 14.

(A-1-2) Connector (Electrical Contactor)

Figure 3:
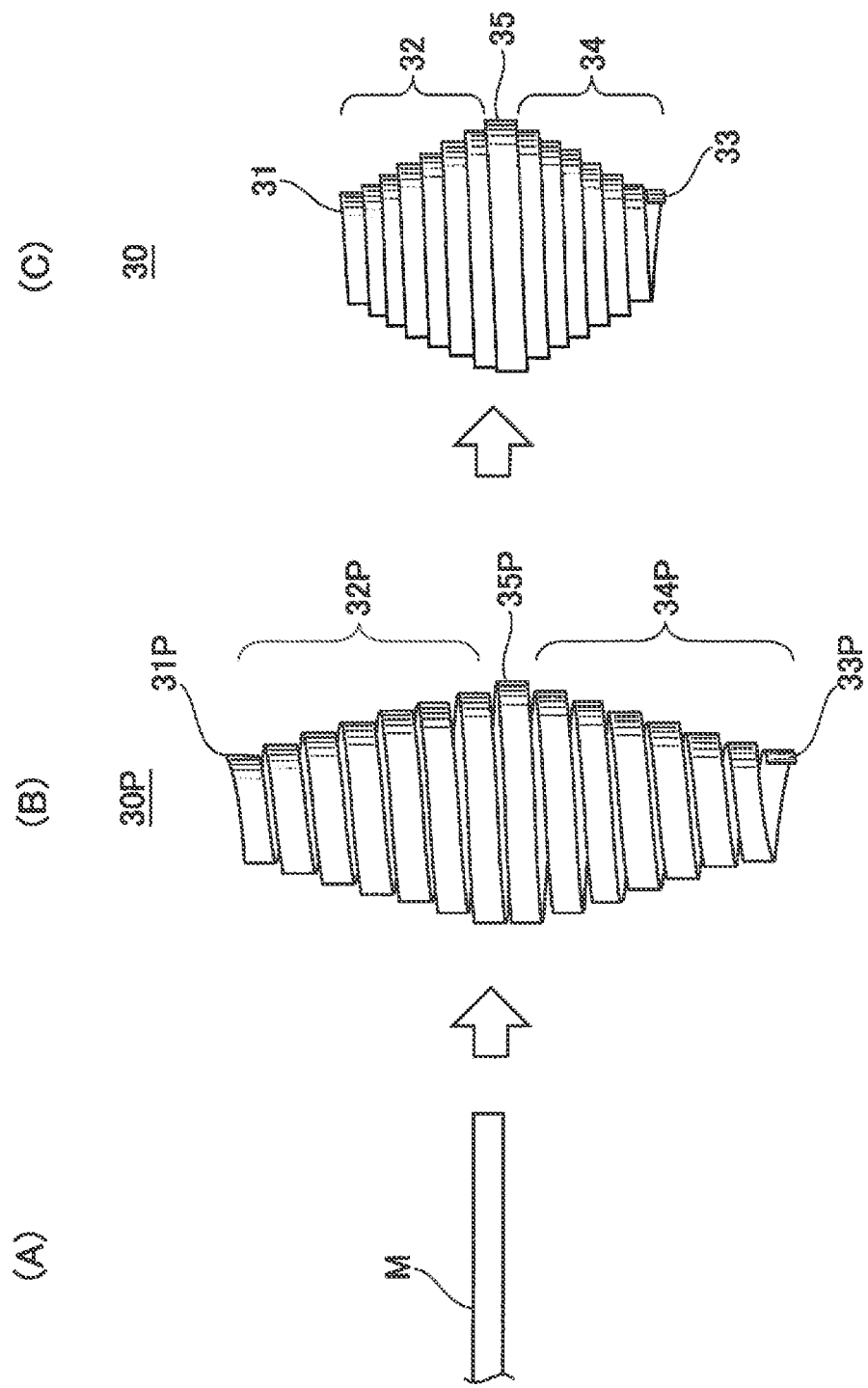
FIG. 3 is an explanatory view showing an outline of a process of forming the connector according to the embodiment.

FIG. 1 is a configuration view showing the configuration of the connector according to the embodiment. FIG. 3 is an explanatory view showing an outline of a process of forming the connector according to the embodiment.

As shown in FIG. 1, the connector 30 as an example of the electrical contactor includes a first contact part 31 to contact the connection terminal 14a of the wiring board 14 as a first contact target, an upper elastic part 32 with an upward volute spring structure to apply elastic bias in the upward and downward directions when the first contact part 31 contacts the connection terminal 14a to receive a load, a second contact part 33 to contact the pad 161a of the substrate member 161 as a second contact target, a lower elastic part 34 with a downward volute spring structure to apply elastic bias in the upward and downward directions when the second contact part 33 contacts the pad 161a to receive a load, and a center part 35 connecting the upper elastic part 32 and the lower elastic part 34.

The first contact part 31 has a tip surface to contact the first contact target, and this tip surface extends diagonally upward. The second contact part 33 has a tip surface to contact the second contact target, and this tip surface extends diagonally downward. The shapes of the first contact part 31 and the second contact part 33 are not limited, but can be processed in various ways.

Regarding the connector 30 shown in FIG. 1, a plate-like member M in FIG. 3(A) is formed into a barrel-shaped connector 30P shown in FIG. 3(B). Then, the connector 30P is formed into the connector 30 of an intended shape (with a volute spring structure extending in the upward and downward directions) shown in FIG. 3(C) using compression and hardening treatment described later. The plate-like member M in FIG. 3 is a member before implementation of forming into the connector 30 in FIG. 1 (connector 30P) and is a plate-like member made of a material having electrical conductivity. Namely, the connector 30 is formed into a spirally-wound structure (volute structure extending in the upward and downward directions) by overlapping a single plate-like member in a volute pattern through a plurality of steps, thereby providing stabilized performance in conducting an electrical signal. In other words, in an electrical contactor formed by combining a plurality of parts, an electrical signal is to be conducted by causing these parts to contact each other. This increases a resistance at a point of contact between these parts, so that conduction performance may become unstable. By contrast, a point of contact between parts is absent in the connector 30 resulting from forming of the plate-like member, allowing reduction in resistance value and achieving stable performance in conducting an electrical signal.

As the connector 30 has volute-shaped elastic bodies acting in the upward and downward directions, contacts with the first contact target and the second contact target can be formed reliably. For this reason, the connector 30 of the embodiment achieves a more advantageous effect than a connector having a volute-shaped elastic body acting only in one direction.

Various type of plate-like members such as plate-like members made of precious metal or metal having electrical conductivity are applicable to the plate-like member M shown in FIG. 3(A). For example, precipitation-hardened copper alloy such as Cu—Be based alloy (beryllium copper) is used preferably as a material having high spring performance. The precipitation-hardened copper alloy is prepared by performing aging treatment on a solution-treated super-saturated solid solution. As a result, fine precipitates are dispersed uniformly to increase the strength of the alloy, while the content of a solid solution element in copper is reduced to achieve improved electrical conductivity. Like the precipitation-hardened copper alloy, palladium alloy is used preferably as the plate-like member M.

The connector 30P shown in FIG. 3(B) is a barrel-shaped connector resulting from forming on the plate-like member M. The connector 30P includes a structure corresponding to each structure part of the connector 30 described above. Specifically, as shown in FIG. 3(B), the connector 30P includes a first contact part 31P, an upper elastic part 32P, a second contact part 33P, a lower elastic part 34P, and a center part 35P connecting the upper elastic part 32P and the lower elastic part 34P.

The connector 30 and the connector 30P differ from each other in that, while the connector 30 has a volute structure formed by winding the plate-like member M into a spiral pattern and covering a part of a wound inner member with an outer member, the connector 30P has a barrel shape formed by winding the plate-like member M into a spiral pattern without generating an overlap in the plate-like member M.

According to the embodiment, for forming the connector 30 having the intended shape (volute structure extending in the upward and downward directions), the plate-like member M shown in FIG. 3(A) is first formed into the barrel-shaped connector 30P shown in FIG. 3(B). Then, the compression and hardening treatment described later is performed to form the connector 30 in a finished structure shown in FIG. 3(C). The following describes a method of manufacturing the connector 30.

[Method of Manufacturing Connector]

Figure 4:
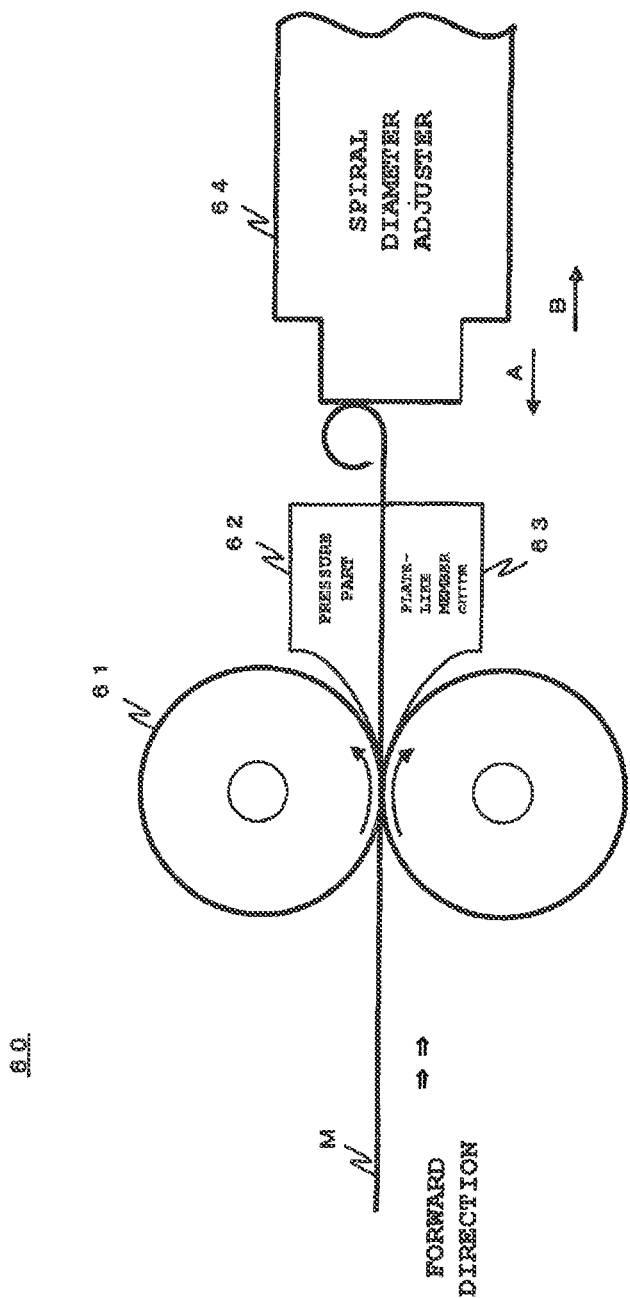
FIG. 4 is an explanatory view showing an outline of a forming unit of a coiling machine according to the embodiment.
Figure 5:
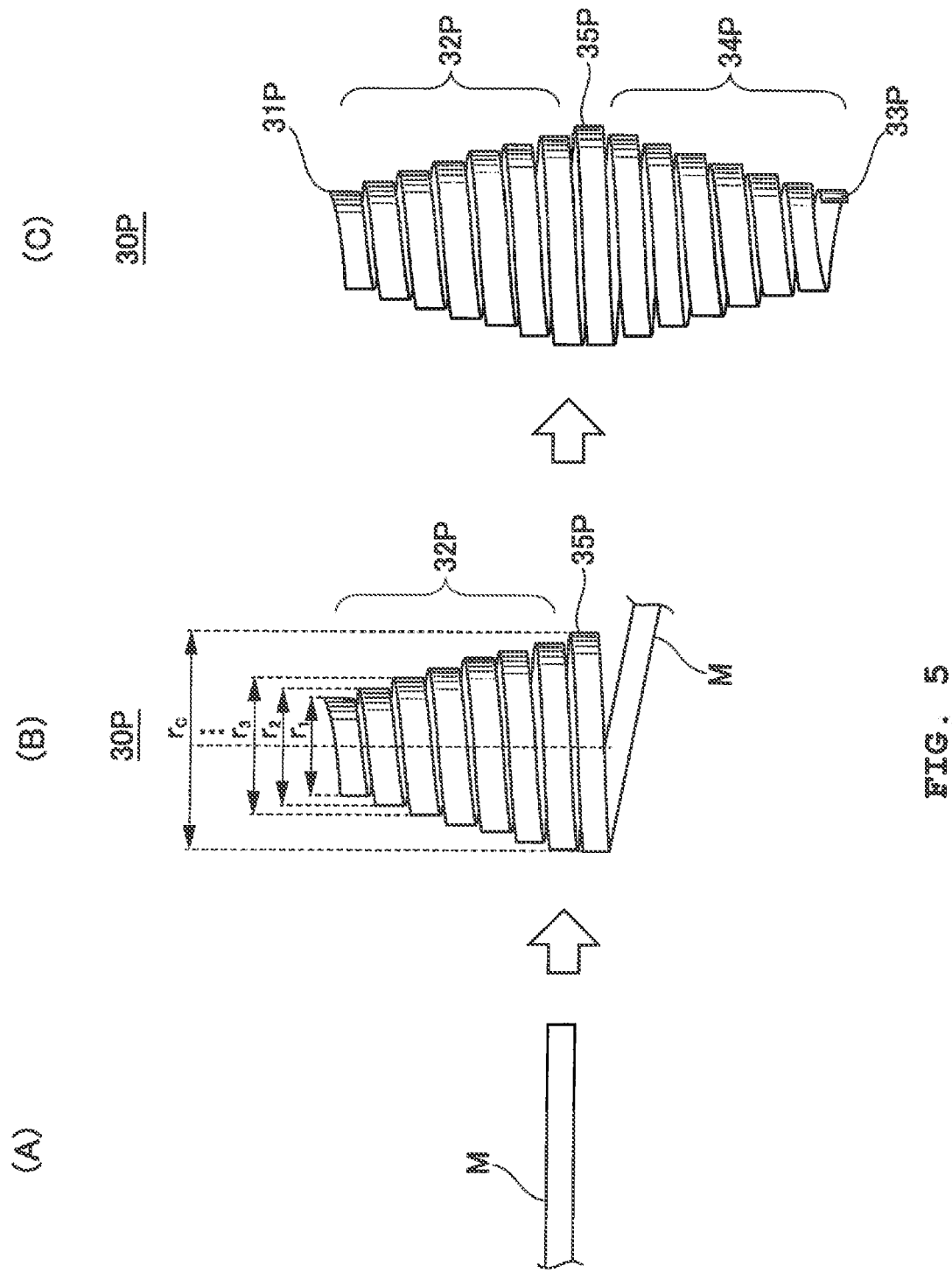
FIG. 5 is an explanatory view explaining a method of manufacturing a barrel-shaped connector according to the embodiment.

In a procedure of manufacturing the connector 30, a coiling machine 60 such as the one shown in FIG. 4 is used to manufacture the connector 30P, for example. FIG. 5 is an explanatory view explaining a method of manufacturing the barrel-shaped connector 30P according to the embodiment.

FIG. 4 shows an outline of a forming unit of the coiling machine. As shown in FIG. 4, the coiling machine 60 includes feed rollers 61 for feeding the plate-like member M continuously, a pressure part 62 for fixing curling of the plate-like member M by pressing the plate-like member M in a direction vertical to one direction of the plate-like member M, a plate-like member guide 63 for guiding the plate-like member M fed from the feed rollers 61 to an appropriate position, and a spiral diameter adjuster 64 for processing the plate-like member M fed through the plate-like member guide 63 into a spiral pattern (in the embodiment, into a barrel shape).

The plate-like member M shown in FIG. 5(A) is fed to the coiling machine 60 (feed rollers 61) from a reel stand not shown in the drawings, for example. After the plate-like member M is fed through the feed rollers 61, curling of the plate-like member M is fixed by the pressure part 62. Then, the plate-like member M passes through the plate-like member guide 63 to be fed to the spiral diameter adjuster 64.

The fed plate-like member M is brought into abutting contact with the spiral diameter adjuster 64 moving forward and backward (in an A direction and a B direction shown in FIG. 4) to be adjusted in spiral diameter, thereby manufacturing a spring of a desired spiral pattern (barrel shape). According to the example described in the embodiment, to facilitate adjustment, only one spiral diameter adjuster 64 is used for manufacturing the barrel-shaped spring of a changing spiral diameter. Alternatively, two or more spiral diameter adjusters 64 may be used. Conventional techniques either in an NC system or a cam system can be used for controlling the spiral diameter adjuster 64 for forming the plate-like member M into a barrel shape in terms of a distance of movement or timing of movement.

FIG. 5(B) shows the barrel-shaped spring in the upper half (upper elastic part 32P). The upper elastic part 32P is formed as the barrel-shaped spring in the upper half by adjusting the spiral diameter adjuster 64 in such a manner that, each time the plate-like member M is wound further, a spiral diameter r becomes larger gradually.

As shown in FIG. 5(B), the upper elastic part 32P has a spiral structure (layered structure) resulting from the winding into spiral diameters from $r_1$ to $r_c$. With the spiral diameter $r_1$ as the smallest diameter, the spiral diameter r becomes larger to be a spiral diameter $r_2$ and a spiral diameter $r_3$ each time the plate-like member M is wound further to reach a maximum spiral diameter $r_c$.

The lower elastic part 34P is formed as a barrel-shaped spring in the lower half by adjusting the spiral diameter adjuster 64 in such a manner that, each time the plate-like member M is wound further, the spiral diameter r becomes smaller gradually.

When the plate-like member M is formed into a barrel shape shown in FIG. 5(C), the plate-like member M is cut with cutting means not shown in the drawings to separate the plate-like member M fed from behind and the connector 30P formed into the barrel shape.

According to the embodiment, the connector 30P (upper elastic part 32P and lower elastic part 34P) has spiral structures vertically symmetric across the center part 35P. However, the upper elastic part 32P and the lower elastic part 34P are not always required to be formed into vertically symmetric spiral structures. For example, the spiral diameter r in each spiral layer in the upper elastic part 32P and the spiral diameter r in a corresponding spiral layer in the lower elastic part 34P are not always required to be equal to each other in terms of the vertically symmetric relationship. Also, the respective spiral layered structures in the upper elastic part 32P and the lower elastic part 34P are not always required to be equal to each other.

The following describes a procedure of manufacturing the connector 30 (volute spring) by performing hardening treatment (heat treatment) on the connector 30P (barrel-shaped spring) in a compressed state (a state of being compressed into a volute structure).

Figure 6:
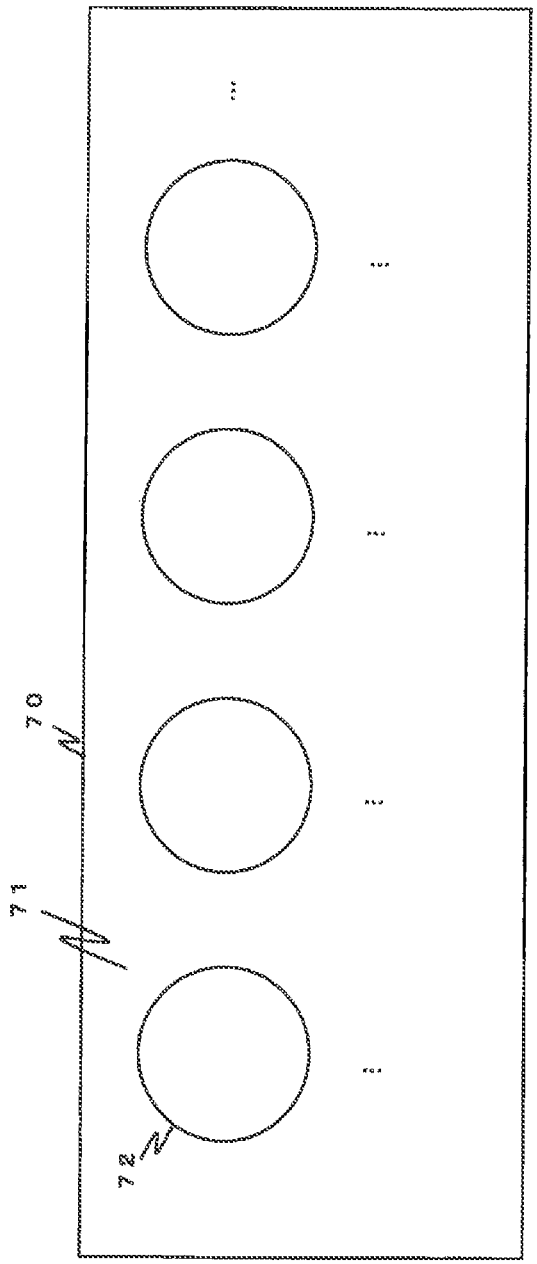
FIG. 6 is an explanatory view showing an example of a storage plate for storing the connector (barrel-shaped spring) in compression and hardening treatment according to the embodiment.

FIG. 6 shows an example of a storage plate for storing the connector 30P (barrel-shaped spring) in compression and hardening treatment according to the embodiment. In FIG. 6, a storage plate 70 includes a storage plate body 71 and a plurality of storage holes 72 in which the connector 30P is to be placed.

Any type of material can be used as a material of the storage plate 70 (storage plate body 71), as long as it has resistance to hardening treatment (heat treatment) described later. Regarding the shape of the storage hole 72, this shape is not limited to a circle (oval or perfect circle) such as the one shown in FIG. 6 but can be any shape, as long as this shape allows the connector 30P to be stored (fixed) in a vertical direction.

Figure 7:
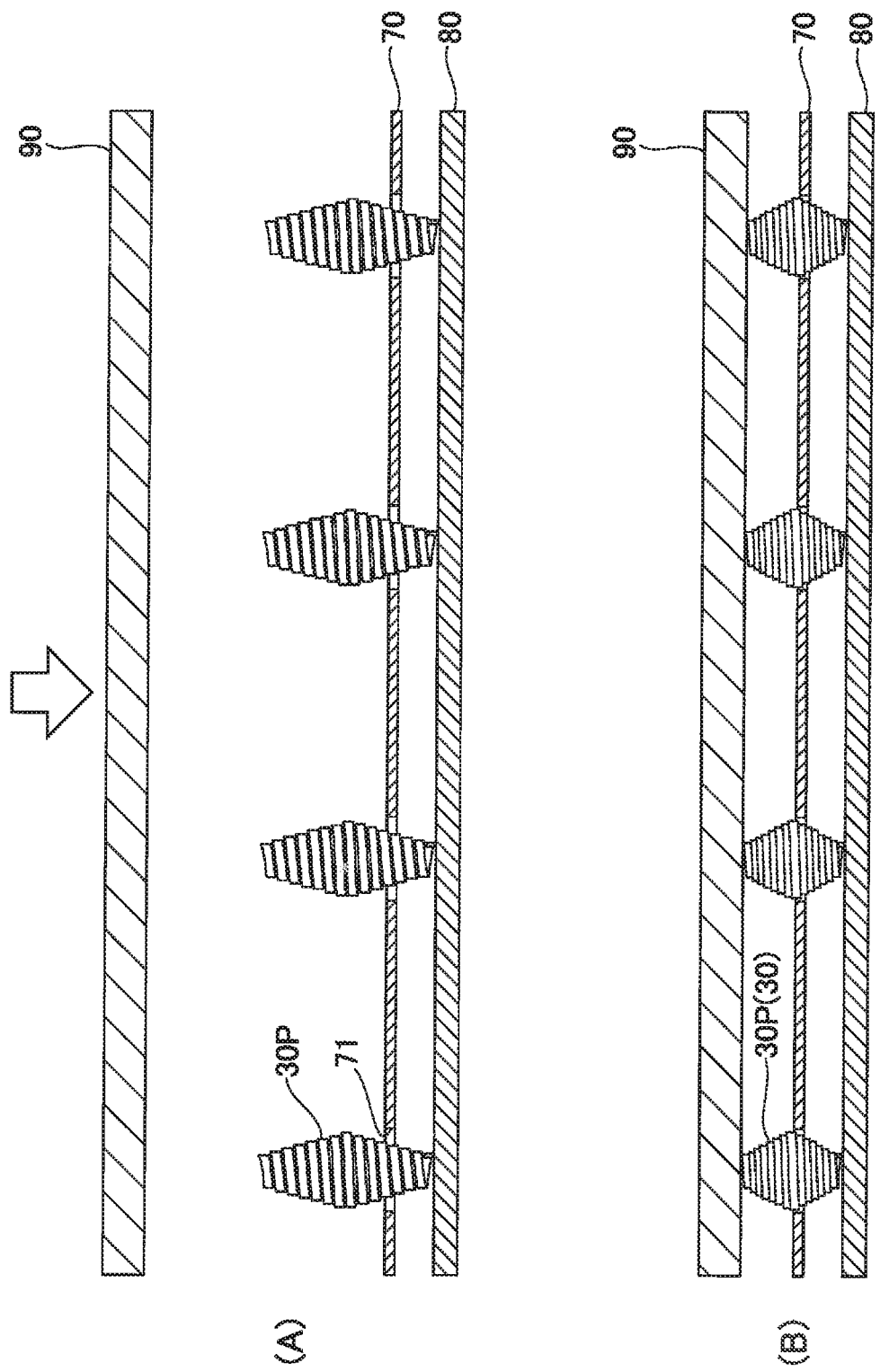
FIG. 7 is an explanatory view showing an outline of a procedure of manufacturing the connector by the compression and hardening treatment according to the embodiment.

FIG. 7 is a view showing an outline of a procedure of manufacturing the connector (volute spring) by the compression and hardening treatment according to the embodiment.

As shown in FIG. 7(A), each connector 30P manufactured by the coiling machine 60 is placed in the storage plate 70 (storage hole 72). Each connector 30P is supported by the storage plate 70 and a fixing plate 80 on which the bottom surface of each connector 30P is supported.

A compression plate 90 is formed of a metallic plate, for example, and is arranged symmetrically with the storage plate 70 and the fixing plate 80. While the compression plate 90 is moved downward by pressure means not shown in the drawings, the compression plate 90 compresses (depresses) the connector 30P from above. The compression plate 90 may be heated in addition to heating in the hardening treatment described later. Then, as shown in FIG. 7(B), the downward movement of the compression plate 90 is stopped to coincide with timing of formation of the barrel-shaped connector 30P into a volute structure by the compression.

Next, the hardening treatment is performed on the connector 30P temporarily assuming the volute structure as a result of the compression treatment. As a result of implementation of the hardening treatment, the connector 30P is retained in the volute structure to become the connector 30 (volute spring).

Regarding the hardening treatment, various types of treatment are applicable in response to the plate-like member M as a source of the connector 30P. If the plate-like member M is made of Cu—Be based alloy, for example, existing heat treatment based on precipitation-hardening is used. Specifically, solution treatment is performed on the connector 30P (an α phase is obtained in which supersaturated Be resulting from rapid cooling from a high temperature of 800° C. or more remains as a solid solution, for example). Then, aging treatment is performed (the result of the solution treatment is heated in a temperature of about 315° C., the supersaturated Be is precipitated as a γ phase, and the precipitated Be is hardened). As a result of the hardening of the alloy by the aging treatment, the volute structure is retained to obtain the connector 30 (volute spring).

If the plate-like member M as a source of the connector 30P is palladium alloy, hardening treatment may also be performed by heat treatment based on precipitation-hardening similar to that described above. Also, various types of hardening treatment (such as quenching and tempering) are also applicable to other materials.

(A-2) Effect of Embodiment

As described above, according to the embodiment, it becomes possible to solve processing constraints on formation into a volute spring structure by lap winding in a spiral pattern. Specifically, a plate member is wound (process of forming the plate member into a barrel shape) while formation of an overlap in a material is avoided, and then an intended shape (volute structure) is formed during the hardening treatment.

The electrical contactor (connector) of the embodiment manufactured by the foregoing manufacturing method has a volute spring structure extending in the upward and downward directions and formed integrally using a single material. This allows the electrical contactor to have mechanical simplicity and excellent functionality, and to function as an electric circuit achieving connection without loss.

(B) Other Embodiments

While the modified embodiment of the present disclosure has been referred to in the foregoing description of the embodiment, the present disclosure is further applicable to the following embodiments.

According to the foregoing embodiment, the plate-like member M (spring material) is processed into a barrel shape using the coiling machine 60, then the barrel-shaped spring is placed in the storage plate 70, and is formed into an intended volute spring structure by the compression and hardening treatment. Alternatively, the coiling machine 60 may be provided with compression means and hardening means, and the connector 30 may be manufactured into a volute spring structure using only the coiling machine 60. This configuration works effectively, particularly if the hardening treatment is to be performed in a short period of time and a small number of connectors 30 are to be manufactured.

REFERENCE SINGS LIST 30, 30P . . . Connector
31 . . . First contact part
32 . . . Upper elastic part
33 . . . Second contact part
34 . . . Lower elastic part
35 . . . Center part
60 . . . Coiling machine
61 . . . Feed roller
62 . . . Pressure part
63 . . . Plate-like member guide
64 . . . Spiral diameter adjuster
70 . . . Storage plate
71 . . . Storage plate body
72 . . . Storage hole
80 . . . Fixing plate
90 . . . Compression plate
M . . . Plate-like member

The invention claimed is:

1. A method of manufacturing an electrical contactor made of a plate-like member having electrical conductivity, comprising:
    a first step of forming the plate-like member into a barrel shape by winding the plate-like member in a spiral pattern;
    a second step of compressing the plate-like member formed into the barrel shape from a vertical direction until the plate-like member assumes a volute shape with an upper spiral structure and a lower spiral structure overlapping each other; and
    a third step of forming a volute-shaped electrical contactor by performing predetermined hardening treatment on the plate-like member temporarily assuming the volute shape as a result of the second step.

2. The method of manufacturing the electrical contactor according to claim 1, wherein
    in the second step, the plate-like member formed into the barrel shape is stored in a storage plate, and then compressed by being pressed from above using a compression plate until the plate-like member assumes the volute shape.

3. An electrical contactor made of a plate-like member having electrical conductivity, and manufactured by:
    forming the plate-like member into a barrel shape by winding the plate-like member in a spiral pattern;
    compressing the plate-like member formed into the barrel shape from a vertical direction until the plate-like member assumes a volute shape with an upper spiral structure and a lower spiral structure overlapping each other; and
    forming the electrical contactor as a volute-shaped electrical contactor by performing predetermined hardening treatment on the plate-like member temporarily assuming the volute shape.

4. The method of manufacturing the electrical contactor according to claim 1, wherein
    the plate-like member is made of beryllium copper or palladium alloy, and
    the hardening treatment is heat treatment based on precipitation-hardening.

\* \* \* \* \*